(12) United States Patent
Lin et al.

(10) Patent No.: US 11,289,470 B2
(45) Date of Patent: Mar. 29, 2022

(54) METHOD OF MANUFACTURING TRENCH TRANSISTOR STRUCTURE

(71) Applicant: Powerchip Semiconductor Manufacturing Corporation, Hsinchu (TW)

(72) Inventors: Wei-Yu Lin, Hsinchu (TW); Shih-Hao Cheng, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/115,799

(22) Filed: Dec. 9, 2020

(65) Prior Publication Data

US 2021/0091067 A1  Mar. 25, 2021

Related U.S. Application Data

(62) Division of application No. 16/168,839, filed on Oct. 24, 2018, now Pat. No. 10,903,203.

(51) Int. Cl.
| | |
|---|---|
| *H01L 29/66* | (2006.01) |
| *H01L 29/78* | (2006.01) |
| *H01L 29/10* | (2006.01) |
| *H01L 29/06* | (2006.01) |
| *H01L 27/02* | (2006.01) |
| *H01L 21/04* | (2006.01) |
| *H01L 21/324* | (2006.01) |
| *H01L 21/761* | (2006.01) |

(52) U.S. Cl.
CPC ...... *H01L 27/0251* (2013.01); *H01L 29/1095* (2013.01); *H01L 29/66734* (2013.01); *H01L 29/7803* (2013.01); *H01L 29/7813* (2013.01)

(58) Field of Classification Search
CPC .................... H01L 29/66734; H01L 29/66727
See application file for complete search history.

(56) References Cited

U.S. PATENT DOCUMENTS

| | | | | |
|---|---|---|---|---|
| 2008/0042208 A1* | 2/2008 | Hshieh | ............... | H01L 29/7813 257/360 |
| 2009/0090967 A1* | 4/2009 | Chen | ................. | H01L 29/66734 257/330 |
| 2009/0212321 A1* | 8/2009 | Hsieh | ................. | H01L 29/66348 257/139 |
| 2010/0289073 A1* | 11/2010 | Hsieh | .................. | H01L 27/0255 257/328 |

(Continued)

*Primary Examiner* — Omar F Mojaddedi
(74) *Attorney, Agent, or Firm* — JCIPRNET

(57) ABSTRACT

A method of manufacturing a trench transistor structure including the following steps is provided. A substrate structure is provided. A first region and a second region are defined in the substrate structure. The substrate structure has a first trench located in the first region and a second trench located in the second region. A transistor device is formed in the first region. The transistor device includes an electrode located in the first trench. The electrode and the substrate structure are isolated from each other. An electrostatic discharge (ESD) protection device is formed in the second region. The ESD protection device includes a main body layer located in the second trench. The main body layer has a planarized top surface. PN junctions are located in the main body layer. The main body layer and the substrate structure are isolated from each other.

10 Claims, 3 Drawing Sheets

(56) References Cited

U.S. PATENT DOCUMENTS

2013/0075810 A1* 3/2013 Hsieh ................ H01L 29/66727
257/328
2016/0233308 A1* 8/2016 Wood ................ H01L 29/66734

* cited by examiner

METHOD OF MANUFACTURING TRENCH TRANSISTOR STRUCTURE

CROSS-REFERENCE TO RELATED APPLICATION

This application is a divisional application of U.S. application Ser. No. 16/168,839, filed on Oct. 24, 2018, now allowed. The entirety of the above-mentioned patent application is hereby incorporated by reference herein and made a part of specification.

BACKGROUND OF THE INVENTION

Field of the Invention

The invention relates to a trench transistor structure and a manufacturing method thereof, and particularly relates to a trench transistor structure with an embedded electrostatic discharge (ESD) protection device and a manufacturing method thereof.

Description of Related Art

The trench metal-oxide-semiconductor field-effect transistor (trench MOSFET) has been widely used in the field of power switch. The trench MOSFET receives control signals by the gate and turns on source and drain to achieve the function of the power switch. When the power switch device is used, the device is often punched through or burned out due to ESD caused by external static electricity. Therefore, the ESD protection device is usually disposed in the device to prevent damage caused by the ESD.

However, in the current trench MOSFET structure, the ESD protection device is usually formed on the substrate, and thus a height difference is created between the trench MOSFET device and the ESD protection device. Therefore, if the degree of the planarization of the subsequently formed dielectric layer is not good enough, the undesired metal bridging will occur in the subsequent interconnect process, and the device reliability and the product yield will be reduced.

SUMMARY OF THE INVENTION

The invention provides a trench transistor structure and a manufacturing method thereof which can effectively prevent the undesired metal bridging from occurring in the subsequent interconnect process.

The invention provides a trench transistor structure, which includes a substrate structure, a transistor device, and an ESD protection device. A first region and a second region are defined in the substrate structure. The substrate structure has a first trench located in the first region and a second trench located in the second region. The transistor device is located in the first region and includes an electrode located in the first trench. The electrode and the substrate structure are isolated from each other. The ESD protection device is located in the second region and includes a main body layer located in the second trench. The main body layer has a planarized top surface. PN junctions are located in the main body layer. The main body layer and the substrate structure are isolated from each other.

According to an embodiment of the invention, in the trench transistor structure, the main body layer may fill up the second trench.

According to an embodiment of the invention, in the trench transistor structure, the bottom of the main body layer may be higher than or equal to the bottom of the electrode.

According to an embodiment of the invention, in the trench transistor structure, the width of the main body layer may be greater than the width of the electrode.

According to an embodiment of the invention, in the trench transistor structure, the substrate structure may have a first conductive type.

According to an embodiment of the invention, in the trench transistor structure, the substrate structure may include a substrate layer and an epitaxial layer. The epitaxial layer is disposed on the substrate layer.

According to an embodiment of the invention, in the trench transistor structure, the ESD protection device may further include at least one first doped region and second doped regions. The first doped region and the second doped region are alternately disposed in the main body layer to form the PN junctions. The first doped region may have the first conductive type, and the second doped region may have a second conductive type.

According to an embodiment of the invention, in the trench transistor structure, the ESD protection device may further include first doped regions and at least one second doped region. The first doped region and the second doped region are alternately disposed in the main body layer to form the PN junctions. The first doped region may have the first conductive type, and the second doped region may have the second conductive type.

According to an embodiment of the invention, the trench transistor structure may further include a body region. The body region is located in the substrate structure at two sides of the electrode. The body region may have the second conductive type.

According to an embodiment of the invention, in the trench transistor structure, the transistor device may further include a doped region. The doped region is located in the body region at one side of the electrode. The doped region may have the first conductive type.

The invention provides a method of manufacturing a trench transistor structure, which includes the following steps. A substrate structure is provided. A first region and a second region are defined in the substrate structure. The substrate structure has a first trench located in the first region and a second trench located in the second region. A transistor device is formed in the first region. The transistor device includes an electrode located in the first trench. The electrode and the substrate structure are isolated from each other. An ESD protection device is formed in the second region. The ESD protection device includes a main body layer located in the second trench. The main body layer has a planarized top surface. PN junctions are located in the main body layer. The main body layer and the substrate structure are isolated from each other.

According to an embodiment of the invention, in the method of manufacturing the trench transistor structure, the depth of the second trench may be less than or equal to the depth of the first trench.

According to an embodiment of the invention, in the method of manufacturing the trench transistor structure, the first trench and the second trench may be separately formed.

According to an embodiment of the invention, in the method of manufacturing the trench transistor structure, the first trench and the second trench may be simultaneously formed.

According to an embodiment of the invention, in the method of manufacturing the trench transistor structure, the substrate structure may have a first conductive type.

According to an embodiment of the invention, in the method of manufacturing the trench transistor structure, the method of forming the PN junctions may include forming at least one first doped region and second doped regions alternately disposed in the main body layer. The first doped region may have the first conductive type, and the second doped region may have the second conductive type.

According to an embodiment of the invention, in the method of manufacturing the trench transistor structure, the method of forming the PN junctions may include forming first doped regions and at least one second doped region alternately disposed in the main body layer. The first doped region may have the first conductive type, and the second doped region may have the second conductive type.

According to an embodiment of the invention, the method of manufacturing the trench transistor structure may further include forming a body region in the substrate structure at two sides of the electrode. The body region may have the second conductive type.

According to an embodiment of the invention, in the method of manufacturing the trench transistor structure, the method of forming the transistor device may include forming a doped region in the body region at one side of the electrode. The doped region may have the first conductive type.

According to an embodiment of the invention, in the method of manufacturing the trench transistor structure, the electrode and the main body layer may be formed by the same material layer.

Based on the above, in the trench transistor structure and the manufacturing method thereof, since both of the transistor device and the ESD protection device are the trench structure, it helps to improve the degree of planarization of the subsequently formed dielectric layer. Therefore, the undesired metal bridging can be effectively prevented in the subsequent interconnect process, thereby improving the device reliability and the product yield.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross-sectional views illustrating a manufacturing process of a trench transistor structure according to an embodiment of the invention.

Figure 1A:
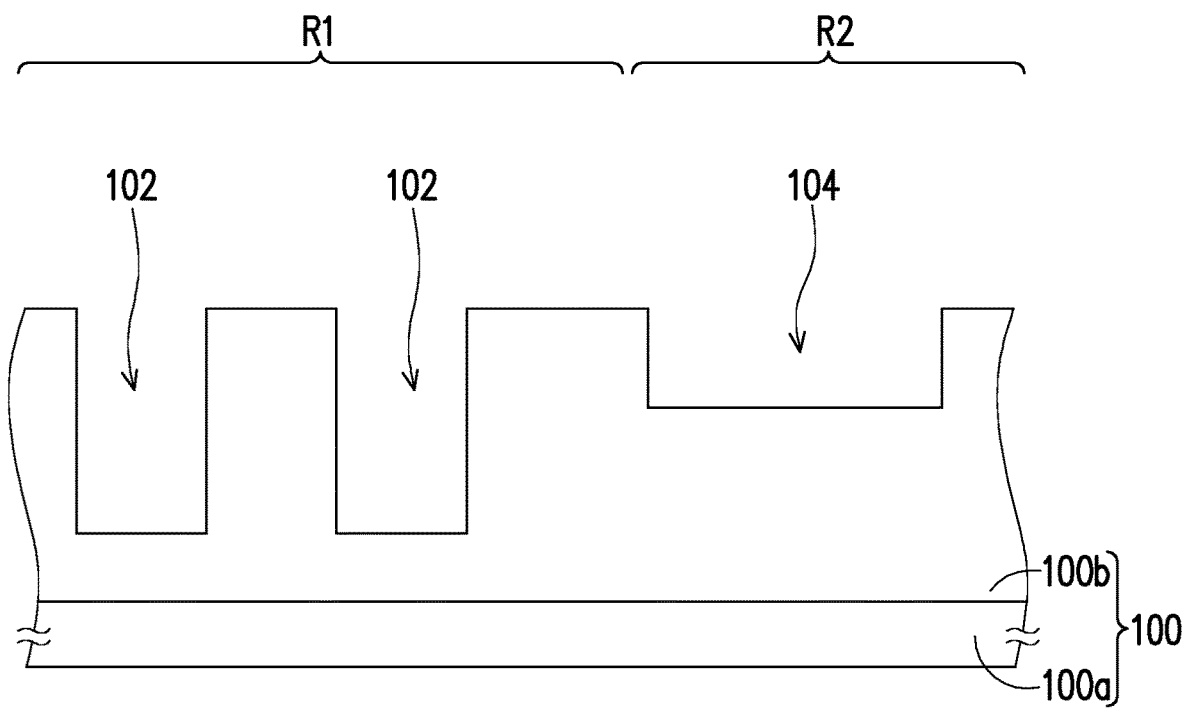
FIG. 1A to FIG. 1E are cross-sectional views illustrating a manufacturing process of a trench transistor structure according to an embodiment of the invention.

Referring to FIG. 1A, a substrate structure 100 is provided. A first region R1 and a second region R2 are defined in the substrate structure 100. The first region R1 may be a transistor device region, and the second region R2 may be an ESD protection device region. The substrate structure 100 may have the first conductive type. Hereinafter, the first conductive type and the second conductive type may be one and the other of an N-type and a P-type, respectively. In the present embodiment, the first conductive type is exemplified by the N-type, and the second conductive type is exemplified by the P-type, but the invention is not limited thereto. In another embodiment, the first conductive type may be the P-type, and the second conductive type may be the N-type.

The substrate structure 100 may include a substrate layer 100a and an epitaxial layer 100b, but the invention is not limited thereto. The substrate layer 100a may have the first conductive type (e.g., the N-type). The material of the substrate layer 100a is, for example, a semiconductor material, such as silicon or the like. The epitaxial layer 100b is disposed on the substrate layer 100a. The epitaxial layer 100b may have a first conductive type (e.g., the N-type). The material of the epitaxial layer 100b is, for example, a semiconductor material, such as silicon or the like.

The substrate structure 100 has a trench 102 located in the first region R1 and a trench 104 located in the second region R2. In the present embodiment, the trench 102 and the trench 104 are exemplified by being formed in the epitaxial layer 100b, but the invention is not limited thereto.

The depth of the trench 104 may be less than or equal to the depth of the trench 102. The width of the trench 104 may be greater than the width of the trench 102. Moreover, in the case where the depth of the trench 104 is less than the depth of the trench 102, the trench 102 and the trench 104 may be separately formed. In the case where the depth of the trench 104 is equal to the depth of the trench 102, the trench 102 and the trench 104 may be simultaneously or separately formed. The method of forming the trench 102 and the trench 104 are, for example, patterning the substrate structure 100 by a lithography process and an etching process. In the present embodiment, the depth of the trench 104 is exemplified by being less than the depth of the trench 102, but the invention is not limited thereto.

Figure 1B:
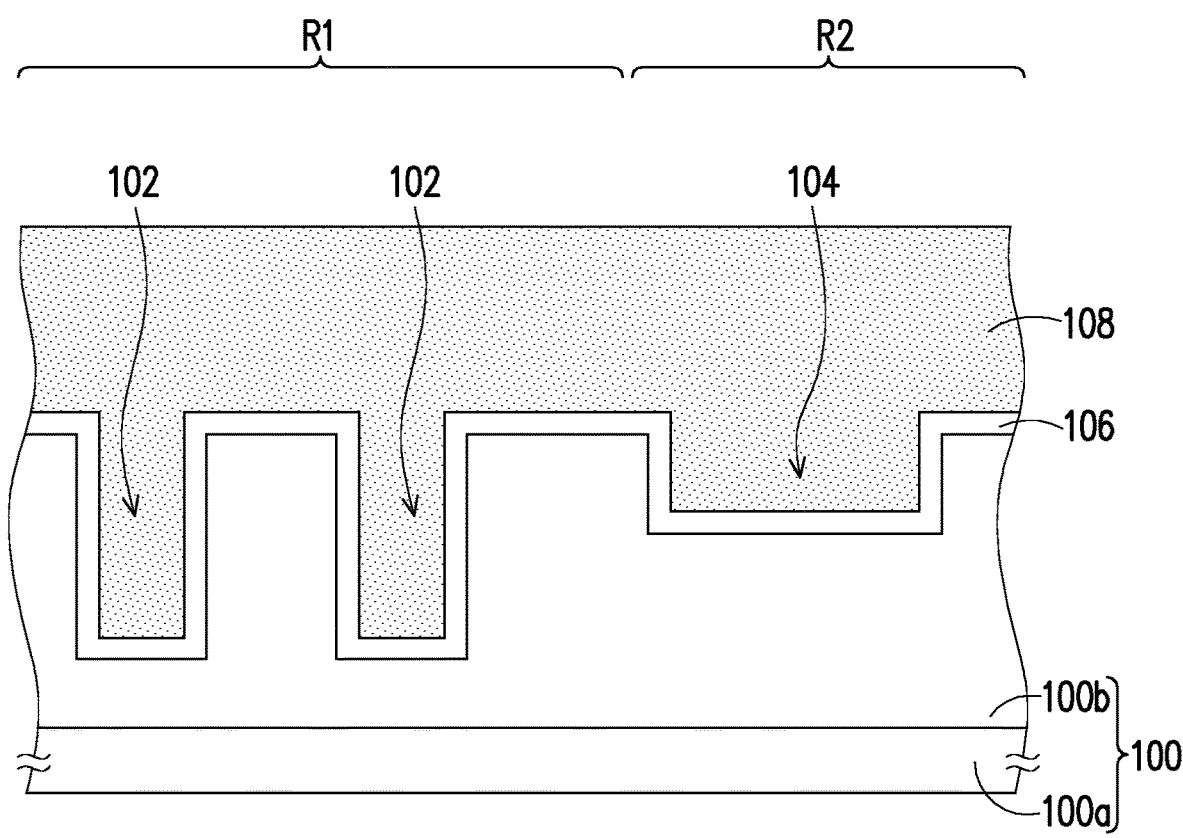

Referring to FIG. 1B, a dielectric layer 106 is formed on the surface of the trench 102 and the surface of the trench 104 of the substrate structure 100. In addition, the dielectric layer 106 may be formed on the top surface of the substrate structure 100. The material of the dielectric layer 106 is, for example, silicon oxide. The method of forming the dielectric layer 106 is, for example, a thermal oxidation method, a chemical vapor deposition (CVD) method, or a combination thereof.

A material layer 108 filling up the trench 102 and the trench 104 is formed on the dielectric layer 106. The material of the material layer 108 is, for example, undoped polysilicon, doped polysilicon, undoped amorphous silicon, or doped amorphous silicon. The method of forming the material layer 108 is, for example, a CVD method. Furthermore, in the case where the material of the material layer 108 is doped polysilicon or doped amorphous silicon, the method of forming the material layer 108 is, for example, a CVD method with in-situ doping. Alternatively, the method of forming the material layer 108 may include the following steps. A polysilicon layer or an amorphous silicon layer may be formed first, and then a doping process is performed on the polysilicon layer or the amorphous silicon layer.

Figure 1C:
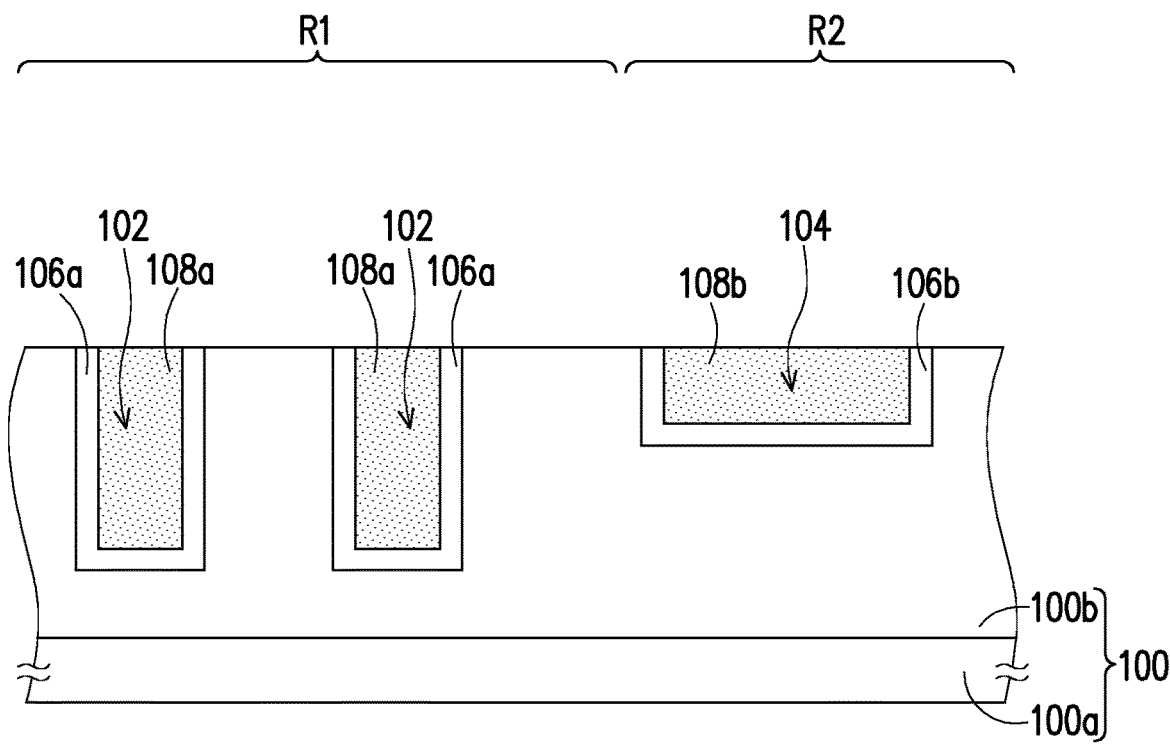

Referring to FIG. 1C, the material layer 108 and the dielectric layer 106 outside the trench 102 and the outside of the trench 104 are removed, so that a dielectric layer 106a and an electrode 108a are formed in the trench 102, and a dielectric layer 106b and a main body layer 108b are formed in the trench 104. It can be seen that the electrode 108a and the main body layer 108b may be formed by the same material layer 108. The dielectric layer 106a is located between the electrode 108a and the substrate structure 100, whereby the electrode 108a and the substrate structure 100 can be isolated from each other. The dielectric layer 106b is located between the main body layer 108b and the substrate structure 100, whereby the main body layer 108b and the substrate structure 100 can be isolated from each other. The electrode 108a and the main body layer 108b may respectively have a planarized top surface. The electrode 108a and the main body layer 108b may respectively fill up the trench 102 and the trench 104. The method of removing the material layer 108 and the dielectric layer 106 outside the trench 102 and outside the trench 104 is, for example, a chemical mechanical polishing (CMP) method, an etch back method, or a combination thereof. Furthermore, although the electrode 108a and the main body layer 108b are formed by the above method, the invention is not limited thereto.

The bottom of the main body layer 108b may be higher than or equal to the bottom of the electrode 108a. In the present embodiment, the bottom of the main body layer 108b is exemplified by being higher than the bottom of the electrode 108a, but the invention is not limited thereto. In addition, the width of the main body layer 108b may be greater than the width of the electrode 108a.

Figure 1D:
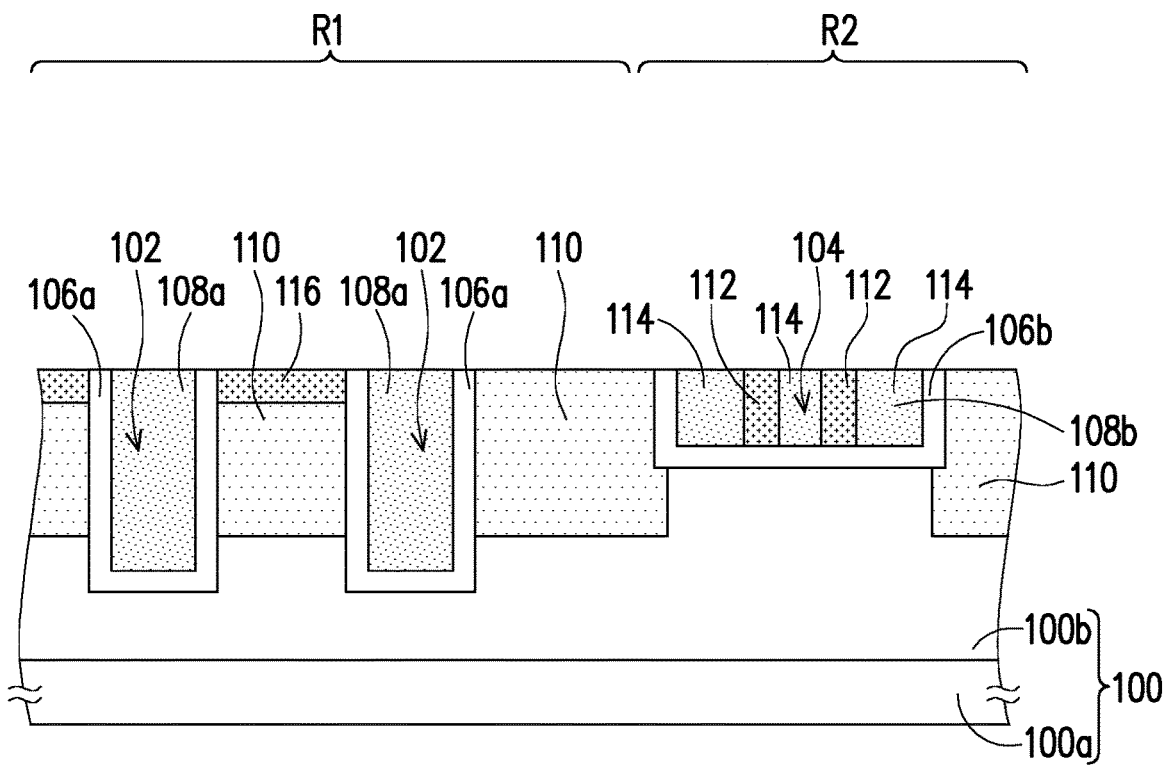

Referring to FIG. 1D, a body region 110 may be formed in the substrate structure 100 at two sides of the electrode 108a. In the present embodiment, the body region 110 is exemplified by being formed in the epitaxial layer 100b, but the invention is not limited thereto. The body region 110 may have a second conductive type (e.g., the P-type). The bottom of the body region 110 may be higher than the bottom of the electrode 108a. The method of forming the body region 110 is, for example, an ion implantation method. In the present embodiment, the ion implantation method is a semiconductor process technology well known to those skilled in the art, whether the ion implantation method requires the use of ion implantation mask can be determined by the process requirements, and the details thereof are not described herein.

PN junctions are formed in the main body layer 108b. The method of forming the PN junctions may include forming doped regions 112 and doped regions 114 alternately disposed in the main body layer 108b. The doped region 112 may have the first conductive type (e.g., the N-type), and the doped region 114 may have the second conductive type (e.g., the P-type). In an embodiment, the number of doped regions 112 may be at least one and the number of doped regions 114 may be multiple to form the PN junctions in the main body layer 108b. In another embodiment, the number of doped regions 112 may be multiple and the number of doped regions 114 may be at least one to form the PN junctions in the main body layer 108b. In the present embodiment, the doped regions 112 and the doped regions 114 alternately disposed in the main body layer 108b are formed, for example, but the invention is not limited thereto.

Furthermore, in the present embodiment, the doped regions at two ends of the main body layer 108b are exemplified by the doped regions 114 of the second conductive type, but the invention is not limited thereto. In another embodiment, the doped regions located at two ends of the main body layer 108b may be the doped regions 112 of the first conductive type.

When the material of the main body layer 108b is a doped material, the PN junctions may be formed by performing one ion implantation process on the main body layer 108b, thereby helping to reduce the process complexity and the quantity of the photomask. For example, in the case where the material of the main body layer 108b is a second conductive type (e.g., the P-type) material, the doped regions 112 of the first conductive type and the doped regions 114 of the second conductive type alternately disposed in the main body layer 108b may be formed by performing an ion implantation process on the main body layer 108b of the second conductive type by using the dopants of the first conductive type. In another embodiment, in the case where the material of the main body layer 108b is a first conductive type (e.g., the N-type) material, the doped regions 112 of the first conductive type and the doped regions 114 of the second conductive type alternately disposed in the main body layer 108b may be formed by performing an ion implantation process on the main body layer 108b of the first conductive type by using the dopants of the second conductive type.

Moreover, when the material of the main body layer 108b is an undoped material, the doped regions 112 of the first conductive type and the doped regions 114 of the second conductive type alternately disposed in the main body layer 108b may be formed by performing an ion implantation process on the main body layer 108b by using the dopants of the first conductive type and performing an ion implantation process on the main body layer 108b by using the dopants of the second conductive type.

Furthermore, a doped region 116 may be formed in the body region 110 at one side of the electrode 108a. The doped region 116 may have the first conductive type (e.g., the N-type). The method of forming the doped region 116 is, for example, an ion implantation method. In some embodiments, in the case where both of the doped region 116 and the doped region 112 are the first conductive type, the doped region 116 and the doped region 112 may be simultaneously formed by the same ion implantation process, thereby helping to reduce the process complexity and the quantity of the photomask.

Figure 1E:
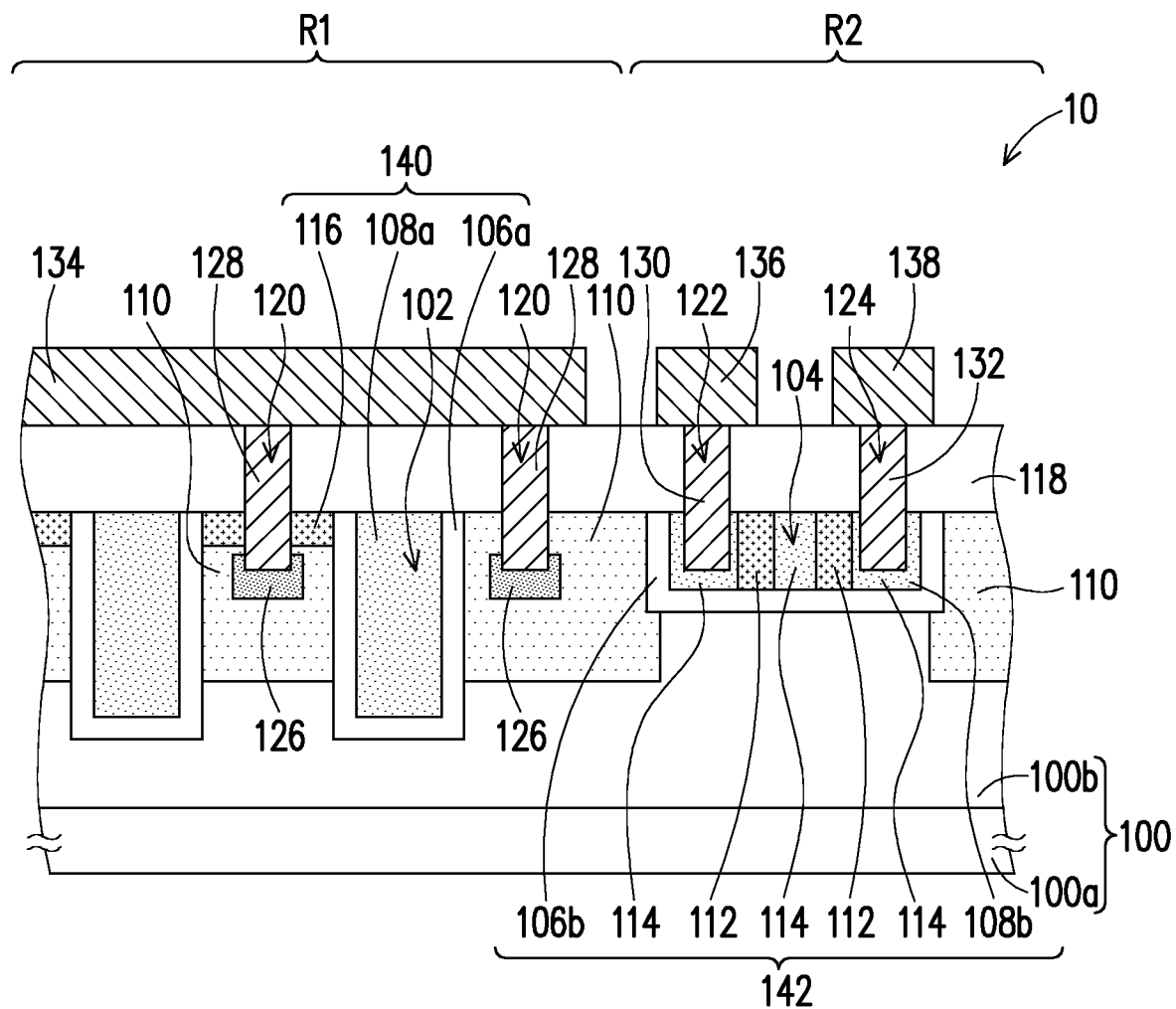

Referring to FIG. 1E, a dielectric layer 118 may be formed on the substrate structure 100. The dielectric layer 118 may be a single-layer structure or a multilayer structure. The material of the dielectric layer 118 is, for example, silicon oxide. The method of forming the dielectric layer 118 is, for example, a CVD method.

An opening 120 may be formed in the dielectric layer 118 of the first region R1, and an opening 122 and an opening 124 may be formed in the dielectric layer 118 of the second region R2. Furthermore, the opening 120 may extend into the substrate structure 100 and may pass through the doped region 116. The opening 122 and the opening 124 may expose the doped regions 114 located at two ends of main body layer 108b and may extend into main body layer 108b.

A doped region 126 may be formed in the body region 110 exposed by the opening 120. The doped region 126 may have the second conductive type (e.g., the P-type). The method of forming the doped region 126 is, for example, an ion implantation method.

A contact 128, a contact 130, and a contact 132 may be respectively formed in the opening 120, the opening 122, and the opening 124. A conductive layer 134, a conductive layer 136, and a conductive layer 138 may be formed on dielectric layer 118. The conductive layer 134 may be electrically connected to the doped region 126 by the contact 128. The conductive layer 136 may be electrically connected to the doped region 114 at one end of the main body layer 108b by the contact 130. The conductive layer 138 may be electrically connected to the doped region 114 at the other end of the main body layer 108b by the contact 132. The material of the contact 128, the contact 130, the contact 132, the conductive layer 134, the conductive layer 136, and the conductive layer 138 may be aluminum, tungsten, or copper. The contact 128, the contact 130, the contact 132, the conductive layer 134, the conductive layer 136, and the conductive layer 138 may be formed by a metal interconnect process. In some embodiments, a barrier layer (not shown) may be formed between the contact 128, the contact 130, the contact 132, the conductive layer 134, the conductive layer 136, the conductive layer 138, and the dielectric layer 118. The material of the barrier layer is, for example, titanium, titanium nitride, or a combination thereof.

By the above method, the transistor device 140 may be formed in the first region R1, and the ESD protection device 142 may be formed in the second region R2, but the method of forming the transistor device 140 and the ESD protection device 142 is not limited to the above method.

Hereinafter, the trench transistor structure 10 of the above embodiment will be described with reference to FIG. 1E. In addition, although the method of forming the trench transistor structure 10 is described by taking the above method as an example, the invention is not limited thereto.

Referring to FIG. 1E, the trench transistor structure 10 includes a substrate structure 100, a transistor device 140, and an ESD protection device 142. Moreover, the trench transistor structure 10 may further include at least one of a body region 110, a dielectric layer 118, a contact 128, a contact 130, a contact 132, a conductive layer 134, a conductive layer 136, and a conductive layer 138. The trench transistor structure 10 may be a trench transistor structure with an embedded ESD protection device 142. A first region R1 and a second region R2 are defined in the substrate structure 100. The substrate structure 100 has a trench 102 located in the first region R1 and a trench 104 located in the second region R2. The substrate structure 100 may have the first conductive type. The substrate structure 100 may include a substrate layer 100a and an epitaxial layer 100b. The epitaxial layer 100b is disposed on the substrate layer 100a. The substrate layer 100a and the epitaxial layer 100b may respectively have the first conductive type.

The transistor device 140 is located in the first region R1. The transistor device 140 includes an electrode 108a located in the trench 102. Moreover, the transistor device 140 may further include at least one of a dielectric layer 106a and a doped region 116. In the present embodiment, the electrode 108a is exemplified by a single-layer structure, but the invention is not limited thereto. In another embodiment, the electrode 108a may be a multilayer structure, and those skilled in the art may adjust the number of layers of the electrode 108a according to the product requirements. The electrode 108a and the substrate structure 100 are isolated from each other. For example, the dielectric layer 106a is located between the electrode 108a and the substrate structure 100, whereby the electrode 108a and the substrate structure 100 can be isolated from each other. The doped region 116 is located in the body region 110 at one side of the electrode 108a. The doped region 116 may have the first conductive type.

The ESD protection device 142 is located in the second region R2. The ESD protection device 142 includes a main body layer 108b located in the trench 104. Moreover, the ESD protection device 142 may further include at least one of doped regions 112, doped regions 114, and a dielectric layer 106b. The main body layer 108b has a planarized top surface. The main body layer 108b may fill up the trench 104. The bottom of the main body layer 108b may be higher than or equal to the bottom of the electrode 108a. In the present embodiment, the bottom of the main body layer 108b is exemplified by being higher than the bottom of the electrode 108a, but the invention is not limited thereto. The width of the main body layer 108b may be greater than the width of the electrode 108a. PN junctions are located in the main body layer 108b. The doped region 112 may have the first conductive type, and the doped region 114 may have the second conductive type. In an embodiment, the number of doped regions 112 may be at least one and the number of doped regions 114 may be multiple to form the PN junctions in the main body layer 108b. In another embodiment, the number of doped regions 112 may be multiple and the number of doped regions 114 may be at least one to form the PN junctions in the main body layer 108b. In the present embodiment, the ESD protection device 142 may include the doped regions 112 and the doped regions 114 alternately disposed in the main body layer 108b, but the invention is not limited thereto. The main body layer 108b and the substrate structure 100 are isolated from each other. For example, the dielectric layer 106b is located between the main body layer 108b and the substrate structure 100, whereby the main body layer 108b and the substrate structure 100 can be isolated from each other.

In addition, the body region 110 is located in the substrate structure 100 at two sides of the electrode 108a. The body region 110 may have the second conductive type. The dielectric layer 118 is disposed on the substrate structure 100. The contact 128, the contact 130, and the contact 132 are respectively disposed in the opening 120, the opening 122, and the opening 124. The conductive layer 134, the conductive layer 136, and the conductive layer 138 are respectively disposed on the dielectric layer 118. The conductive layer 134 may be electrically connected to the doped region 126 by the contact 128. The conductive layer 136 may be electrically connected to the doped region 114 at one end of the main body layer 108b by the contact 130. The conductive layer 138 may be electrically connected to the doped region 114 at the other end of the main body layer 108b by the contact 132.

Furthermore, the material, the arrangement, the forming method, the effect and the like of each component in the trench transistor structure 10 of FIG. 1E have been described in detail in the above embodiments and are not repeated herein.

Based on the above, in the trench transistor structure 10 of the above embodiment and the manufacturing method thereof, since the electrode 108a and the main body layer 108b are respectively located in the trench 102 and the trench 104, both of the transistor device 140 and the ESD protection device 142 can be the trench structure. Thus, the height difference between the transistor device 140 and the ESD protection device 142 can be reduced, thereby improving the degree of planarization of the subsequently formed dielectric layer 118. Therefore, the undesired metal bridging can be effectively prevented in the subsequent interconnect process, thereby improving the device reliability and the product yield.

In summary, in the trench transistor structure of the aforementioned embodiments and the manufacturing method thereof, since both of the transistor device and the ESD protection device are the trench structure, the undesired metal bridging can be effectively prevented in the subsequent interconnect process. Therefore, the trench transistor structure can have better device reliability and product yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a trench transistor structure, comprising:
   providing a substrate structure, wherein a first region and a second region are defined in the substrate structure, and the substrate structure has a first trench located in the first region and a second trench located in the second region;
   forming a transistor device in the first region, wherein the transistor device comprises an electrode located in the first trench, and the electrode and the substrate structure are isolated from each other; and
   forming an ESD protection device in the second region, wherein
   the ESD protection device comprises a main body layer located in the second trench,
   the main body layer has a planarized top surface,
   PN junctions are located in the main body layer,
   the main body layer and the substrate structure are isolated from each other,
   a top surface of the electrode, the planarized top surface of the main body layer, and a top surface of the substrate structure have the same height, and
   a bottom of the main body layer is higher than a bottom of the electrode.

2. The method of manufacturing the trench transistor structure according to claim 1, wherein a depth of the second trench is less than or equal to a depth of the first trench.

3. The method of manufacturing the trench transistor structure according to claim 1, wherein the first trench and the second trench are separately formed.

4. The method of manufacturing the trench transistor structure according to claim 1, wherein the first trench and the second trench are simultaneously formed.

5. The method of manufacturing the trench transistor structure according to claim 1, wherein the substrate structure has a first conductive type.

6. The method of manufacturing the trench transistor structure according to claim 5, wherein a method of forming the PN junctions comprises:
   forming at least one first doped region and second doped regions alternately disposed in the main body layer, wherein the at least one first doped region has the first conductive type, and the second doped regions have a second conductive type.

7. The method of manufacturing the trench transistor structure according to claim 5, wherein a method of forming the PN junctions comprises:
   forming first doped regions and at least one second doped region alternately disposed in the main body layer, wherein the first doped regions have the first conductive type, and the at least one second doped region has a second conductive type.

8. The method of manufacturing the trench transistor structure according to claim 5, further comprising:
   forming a body region in the substrate structure at two sides of the electrode, wherein the body region has a second conductive type.

9. The method of manufacturing the trench transistor structure according to claim 8, wherein a method of forming the transistor device comprises:
   forming a doped region in the body region at one side of the electrode, wherein the doped region has the first conductive type.

10. The method of manufacturing the trench transistor structure according to claim 1, wherein the electrode and the main body layer are formed by the same material layer.

* * * * *